US008849603B2

(12) United States Patent
Boldrin et al.

(10) Patent No.: US 8,849,603 B2
(45) Date of Patent: Sep. 30, 2014

(54) SYSTEMS AND METHODS FOR CONTROL SYSTEM VERIFICATION AND HEALTH ASSESSMENT

(75) Inventors: Clete M. Boldrin, Bellevue, WA (US); Ali R. Mansouri, Bothell, WA (US); John L. Vian, Renton, WA (US)

(73) Assignee: The Boeing Company, Chicago, IL (US)

( * ) Notice: Subject to any disclaimer, the term of this patent is extended or adjusted under 35 U.S.C. 154(b) by 1170 days.

(21) Appl. No.: 12/275,613

(22) Filed: Nov. 21, 2008

(65) Prior Publication Data

US 2010/0131238 A1 May 27, 2010

(51) Int. Cl.
G01M 7/00 (2006.01)
G01M 9/00 (2006.01)
G01C 25/00 (2006.01)
G06F 11/30 (2006.01)
G21C 17/00 (2006.01)
G01M 17/00 (2006.01)
G01R 31/00 (2006.01)
G05B 23/02 (2006.01)
G06F 11/34 (2006.01)

(52) U.S. Cl.
CPC ............. *G01M 17/00* (2013.01); *G01R 31/008* (2013.01); *G05B 23/02* (2013.01); *G06F 11/3409* (2013.01)
USPC .......................... 702/116; 702/113; 702/182

(58) Field of Classification Search
CPC ... G06F 11/3409; G05B 23/02; G01M 17/00; G01R 31/008
USPC .......................................... 702/116, 182, 113
See application file for complete search history.

(56) References Cited

U.S. PATENT DOCUMENTS

| | | | | |
|---|---|---|---|---|
| 5,023,791 | A * | 6/1991 | Herzberg et al. | 701/35 |
| 5,079,707 | A * | 1/1992 | Bird et al. | 701/35 |
| 5,111,402 | A * | 5/1992 | Brooks et al. | 701/35 |
| 5,260,874 | A * | 11/1993 | Berner et al. | 701/36 |
| 5,671,141 | A * | 9/1997 | Smith et al. | 701/29 |
| 6,341,247 | B1 | 1/2002 | Hreha et al. | 701/3 |
| 6,622,972 | B2 * | 9/2003 | Urnes et al. | 244/194 |
| 7,255,309 | B2 | 8/2007 | Boldrin et al. | 244/208 |
| 8,000,844 | B2 * | 8/2011 | Mottura | 701/3 |
| 2003/0167111 | A1 * | 9/2003 | Kipersztok et al. | 701/29 |
| 2008/0009983 | A1 * | 1/2008 | Mottura | 701/3 |
| 2010/0018301 | A1 * | 1/2010 | Lutke et al. | 73/118.03 |
| 2010/0312420 | A1 * | 12/2010 | Sham et al. | 701/3 |

OTHER PUBLICATIONS

Bošković, Jovan D.; Redding, Joshua, and Mehra, Raman K. "Integrated Health Monitoring and Adaptive Reconfigurable Control", AAIA Guidance, Navigation and Control Conference and Exhibit Aug. 20-23, 2007, AIAA 2007-6423, Hilton Head, South Carolina, pp. 1-16.

(Continued)

*Primary Examiner* — Michael Nghiem

(57) ABSTRACT

A method of testing a component of a mobile platform without using an aircraft control system of the mobile platform, where the component forms a part of the aircraft control system. The method may involve using a test controller independent of the aircraft control system to initiate a test operation. The test operation is used to generate a test signal. The test signal is applied to a test subsystem carried on the mobile platform but operable independent of the aircraft control system. The test subsystem is used to act on the component of the aircraft control system. A response of the component may then be evaluated.

17 Claims, 8 Drawing Sheets

(56) References Cited

OTHER PUBLICATIONS

Oppenheimer, Michael W. and Doman, David B. "Efficient Reconfiguration and Recovery From Damage for Air Vehicles", AAIA Guidance, Navigation, and Control Conference and Exhibit Aug. 21-24, 2006, AIAA 2006-6552, Keystone, Colorado, pp. 1-29.

Stalker, A., Cerchie, D.; Cullen, L., and Wygnanski, I. "Using Periodic Perturbations for Download Alleviation on Tilt-Rotor Airplane Models in Hover", 2nd AIAA Flow Control Conference Jun. 28-Jul. 1, 2004, AIAA-2004-2515, Portland, Oregon, pp. 1-31.

* cited by examiner

SYSTEMS AND METHODS FOR CONTROL SYSTEM VERIFICATION AND HEALTH ASSESSMENT

FIELD

The present disclosure relates to test and monitoring systems, and more particularly to a test and monitoring system for non-intrusively testing various components of a control system of a vehicle, device or apparatus.

BACKGROUND

The statements in this section merely provide background information related to the present disclosure and may not constitute prior art.

Most modern aircraft have stability augmentation systems to enable fly-by-wire operation. Furthermore most, if not all, state-of-the-art high-performance military aircraft have advanced specialized control augmentation systems with selectable task-tailored control laws. Such systems enable the pilot to maneuver the aircraft to its performance limits and perform tasks such as precision tracking of targets.

It is extremely important that the aircraft and its subsystems, including the augmented control system, are accurately modeled to support design and performance assessment efforts. However, at the same time, most high-performance and precision flight applications are capable of generating control surface actuator performance requirements that exceed the capability of state-of-the-art actuator technology, which primarily involves electro-hydraulic actuators.

Performance limitations of present day electro-hydraulic and electromechanical actuators are predominantly bandwidth related. These performance limitations are typically due to size, weight, power and cost relating to such actuators. Such actuators also suffer from inherent characteristics such as high levels of backlash, hysteresis and nonlinearity due to variables such as gear heads, actuator linkages, hydraulic fluid viscosity, aging etc. Additionally, the ability to determine the health of the closed-loop actuators of the aircraft is highly important to achieving mission objectives and ensuring safe operation of the aircraft.

With present day systems, one specific drawback is the inability to identify a primary control surface malfunction before it can destabilize an aircraft. Another drawback is the inability to verify and validate aircraft control systems during flight. Design, verification and validation of aircraft require understanding the dynamic behavior of the aircraft and control system. This is traditionally achieved through ground vibration tests, wind tunnel tests, simulated hardware in the loop tests, and flight testing. These tests can be extremely expensive, require specialized equipment, and have limitations with respect to the feasibility of using excitation test signals that have sufficient bandwidth and that can be decoupled from the systems being measured. Existing solutions rely on the aircraft control system to generate test signals. Thus, there presently is no way to independently assess the aircraft's control system during these tests.

SUMMARY

In one aspect the present disclosure relates to a method of testing a component of a mobile platform without using an aircraft control system of the mobile platform, where the component forms a part of the aircraft control system. The method may comprise using a test controller independent of the aircraft control system to initiate a test operation. The test operation may be used to generate a test signal. The test signal may be applied to a test subsystem carried on the mobile platform but operable independent of the aircraft control system. The test subsystem may be used to act on the component of said aircraft control system. A response of the component may then be evaluated.

In another aspect the present disclosure relates to a method of testing a component of a mobile platform without using an on-board control system of the mobile platform. The method may comprise initiating a desired test control operation. The desired test control operation may be used to control a test signal generating subsystem independent of the on-board control system, but still present on the mobile platform, to generate a test signal. The test signal may be applied to a test subsystem carried on the mobile platform only for test purposes, and operable independently of the on-board control system of the mobile platform, the test subsystem acting on the component of the mobile platform. A response of the component of the mobile platform may be monitored to determine a performance of the component.

In another aspect the present disclosure relates to a system for testing a component of a mobile platform without using an on-board control system of the mobile platform. The system may comprise a controller, independent of the on-board control system, to generate a test operation. A perturbance test signal generating system, independent of the on-board control system, and responsive to the controller, may be used for generating a perturbance test signal. A test subsystem carried on the mobile platform but operable independent of the on-board control system, and being responsive to the perturbance test signal, may be used for influencing operation of the component of the mobile platform. The controller may be further adapted to evaluate a response by the component of the mobile platform.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

Figure 1:
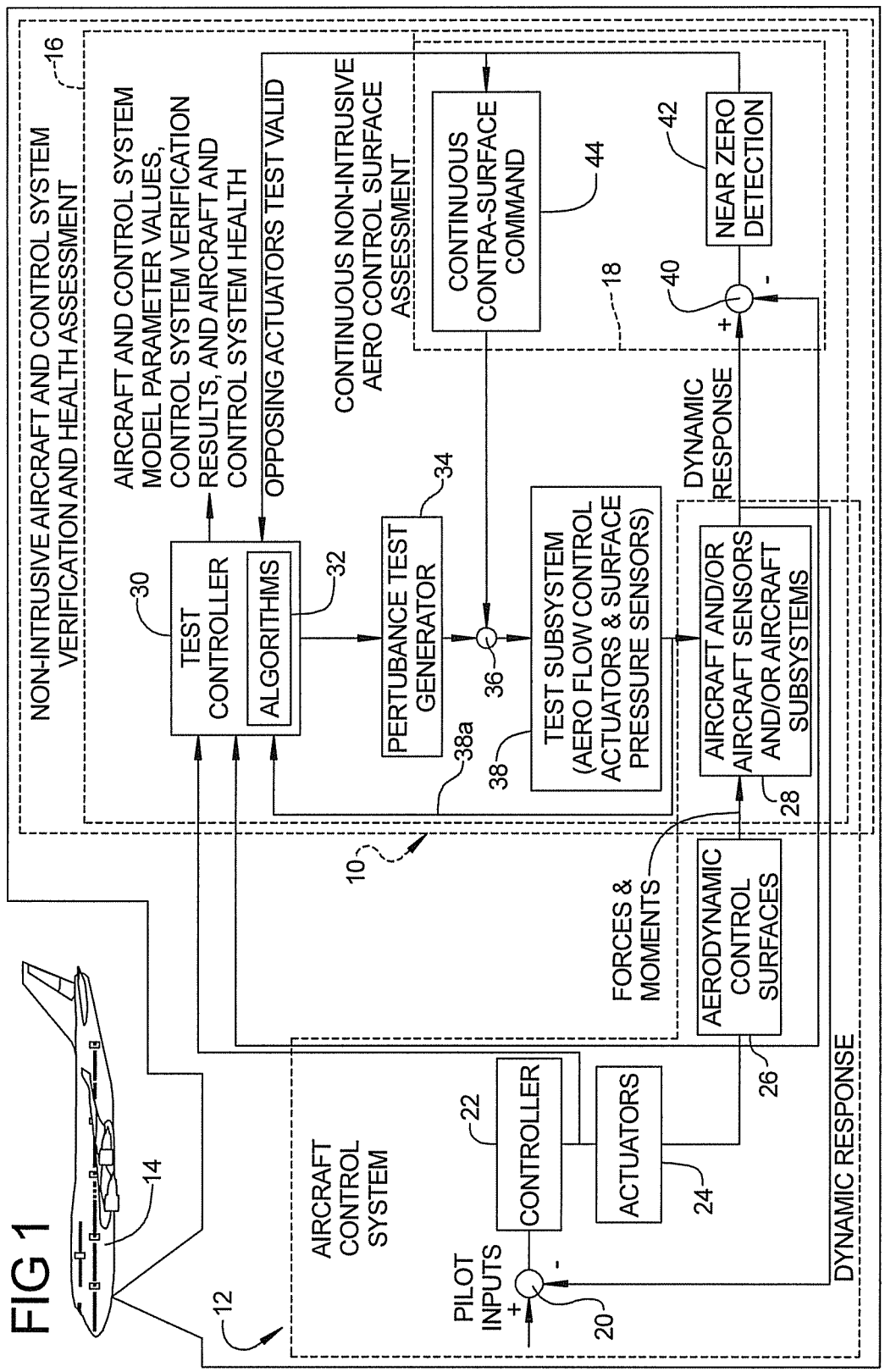
FIG. 1 is a high level block diagram of a system in accordance with one embodiment of the present disclosure.

The following description is merely exemplary in nature and is not intended to limit the present disclosure, application, or uses. It should be understood that throughout the drawings, corresponding reference numerals indicate like or corresponding parts and features.

The present disclosure describes novel systems and methods to non-intrusively characterize and model the dynamic response of individual hinged control surface effectors typically used on mobile platforms, and even more particularly on airborne mobile platforms such as aircraft. The systems and methods disclosed herein enable small magnitude, test commanded surface motions to be instantaneously countered by the same agile independent active flow control actuators used to characterize each surface of the mobile platform. This nullification of small magnitude test commands to electro-hydraulic actuators on the mobile platform enables determination of the health of backup control systems of the mobile platform without disturbing the states of the mobile platform (or other form of vehicle, device or apparatus) while in service, and advantageously is transparent to normal operation of the primary control system of the mobile platform, device or apparatus.

Referring to FIG. 1 there is shown a system 10 for non-intrusively testing the performance of an aircraft control system 12 (i.e., an "on-board control system") carried on a mobile platform 14. The mobile platform 14 is illustrated merely for discussion purposes as a jet aircraft, and will be referred to throughout the following discussion as "the aircraft 14". However, the present system 10 may be used with any form of mobile platform. Such other mobile platforms may be motor land vehicles, surface or underwater marine vessels, space vehicles, rotorcraft, as well as unmanned mobile vehicles. The system 10 is equally well adapted for use with fixed (i.e., non-mobile) systems where a desire to test or evaluate the operation of one or more subsystems of the non-mobile system is needed. Such non-mobile applications might involve, without limitation, manufacturing or robotic machinery.

The system 10 can be viewed as comprising a first portion 16 that forms a non-intrusive aircraft and control system verification and health assessment subsystem. A second portion 18 may be viewed as forming a continuous, non-intrusive aerodynamic control surface assessment subsystem. In this example the first portion is well suited for testing specific aircraft subsystems such as sensors, flaps, ailerons, valves, etc., while the second portion 18 is especially well suited for evaluating the control laws implemented by the aircraft control system 12.

It will be understood that the aircraft control system 12 may be tailored to the specific type of mobile platform that is being used on. The aircraft control system 12 thus forms a permanent portion of the aircraft 14 and is used to control operation of the aircraft 14 and its diverse components and subsystems. Merely as an example, the aircraft control system 12 may include a summing junction 20 for receiving pilot inputs, a controller 22 and one or more actuators 24 controllable by the controller 22. The one or more actuators 24 may control one or more aerodynamic control surfaces 26, which in turn may control one or more aircraft sensors, and/or aircraft subsystems, and/or other component(s) 28. For convenience, the following discussion will simply refer to component 28 as the "sensor", although it will be appreciated that virtually any type of component, sensor or subsystem of the aircraft 14 may be tested.

First portion 16 of the system 10 includes a test controller 30 that is loaded with one or more specific algorithms 32. The algorithms 32 are used to implement specific test operations to test and evaluate the performance of virtually any of the subsystems or components of the aircraft's control system 12. The test controller 30, which is independent of the aircraft's on-board control system 12, also receives an input from the controller 22 that identifies important parameters of operation of the aircraft control system 12 that the test controller 30 may need to know to implement specific tests of various components of the aircraft control system 12. Such specifics may be the specific types of flow control sensors or components being used and performance attributes of such components or systems. For example, a specific model number or type of sensor 28 may be supplied to the test controller 30 by the aircraft's controller 22.

The first portion 16 further may include a perturbance test signal system or generator 34 that is responsive to the test controller 30 for generating a perturbance test signal. The perturbance test signal may be applied to a summing junction 36 and then to a test subsystem 38, which may be termed for convenience an "aero flow control subsystem". The aero flow control subsystem 38 influences operation of the aircraft sensors 28. In practice the aero flow control subsystem 38 may comprise active flow control component such as an electromagnetic oscillatory jet actuator that is either built in to a structural portion of the aircraft 14 adjacent a component to be tested. The aero flow control subsystem 38 is controllable completely independently of the controller 22 so that the effect of its generated flow (i.e., aerodynamic influence) on the aircraft sensor(s) may be studied. A feedback signal represented by feedback line 38a is fed back into the test controller 30 to form a closed loop arrangement for controlling and monitoring the aero flow control subsystem 38.

Figure 2A:
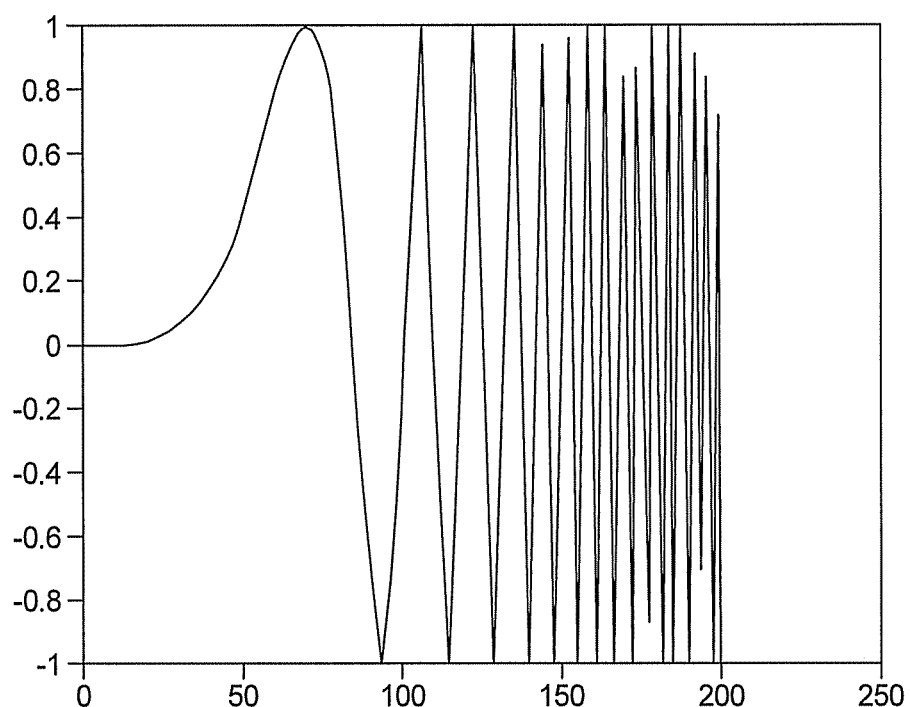
FIGS. 2A-2E show various types of perturbance test signals that may be generated by the system when implementing a test operation on an existing component or subsystem of the mobile platform of FIG. 1.
Figure 2B:
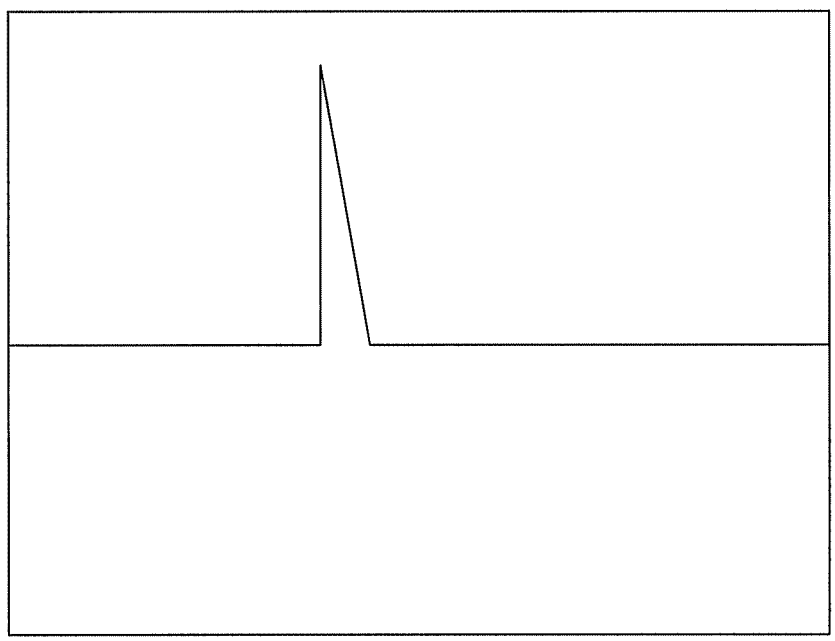
Figure 2C:
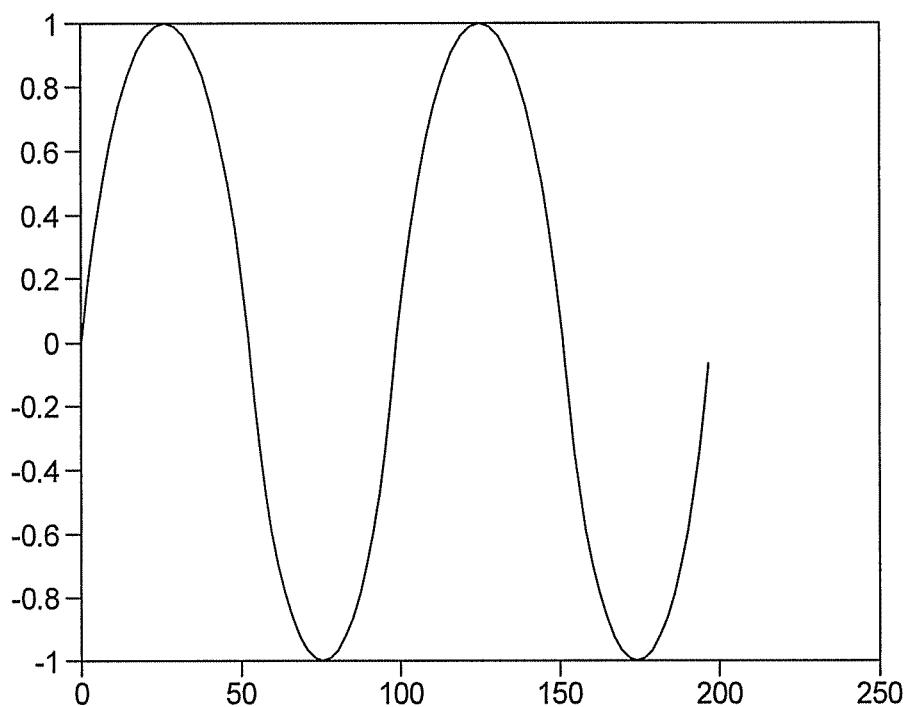
Figure 2D:
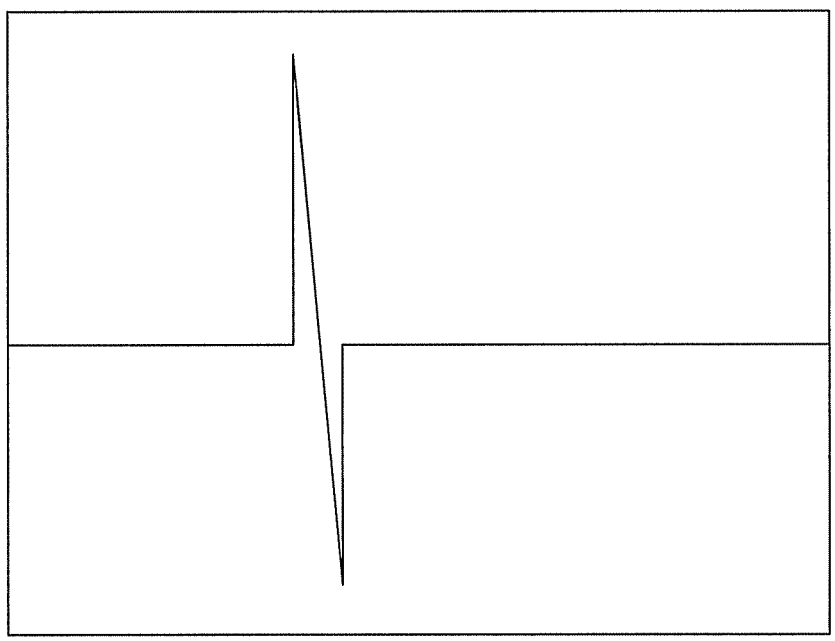
Figure 2E:
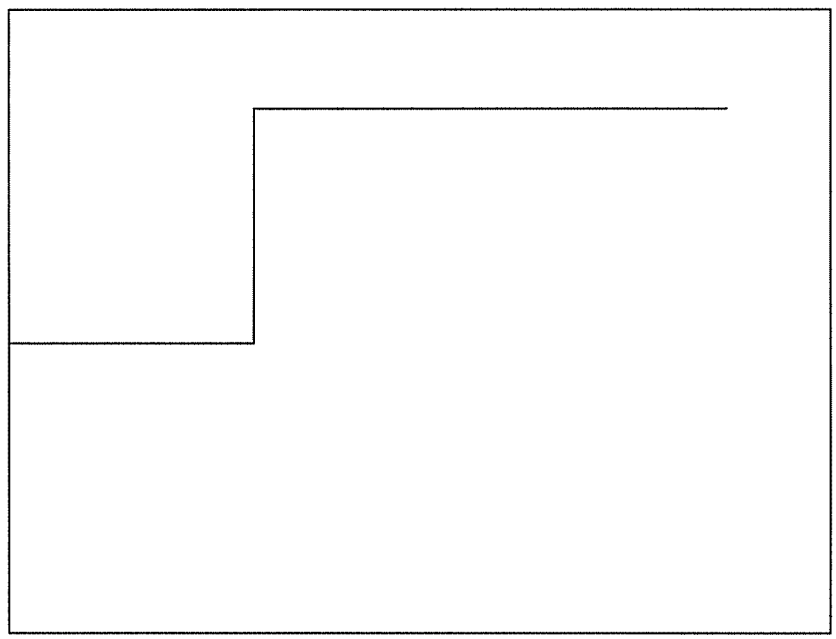

Various potential forms of the perturbance test signal that may be generated from the perturbance test signal generator 34 are shown in FIGS. 2A-2E. Potential perturbance signals may comprise decaying oscillatory signals (FIG. 2A), transients (FIG. 2B), frequency constant sinusoidal waveforms (FIG. 2C), short sinusoidal like transients (FIG. 2D) and square wave signals (FIG. 2E). However, it will be appreciated that these waveforms are merely exemplary, and virtually any other form of input signal may be used as the component or subsystem being tested dictates.

The output of the aircraft sensor(s) 28 may be fed back to the summing junction 20 to thus modify the resulting signal applied to the aircraft's controller 22. The output from the aircraft sensor(s) 28 may also be applied to a summing junction 40 of the second portion 18. A near zero detection subsystem 42 may form a hardware or software implemented subsystem that generates a particular signal when the output from the summing junction 40 is zero or within an acceptable range around zero. It will be appreciated that subsystem 42 is particularly useful for those scenarios where the aircraft would be flying straight and level. However, it will be understood that subsystem 42 would not be active during dynamic aircraft maneuvers, and thus would not be needed while monitoring dynamic aircraft maneuvers.

The output of the near zero detection subsystem 42 may be fed back to the test controller 30 as well as to a continuous contra-surface command subsystem 44. Subsystem 44 removes the effects of small steady-state control command off-sets from the test operations performed in the test controller 30. The output of the continuous contra-surface command subsystem 44 may be applied to the summing junction 36 to further modify the perturbance test signal that is used to control the subsystem 28 that acts on the aircraft sensor(s) 28.

Figure 3:
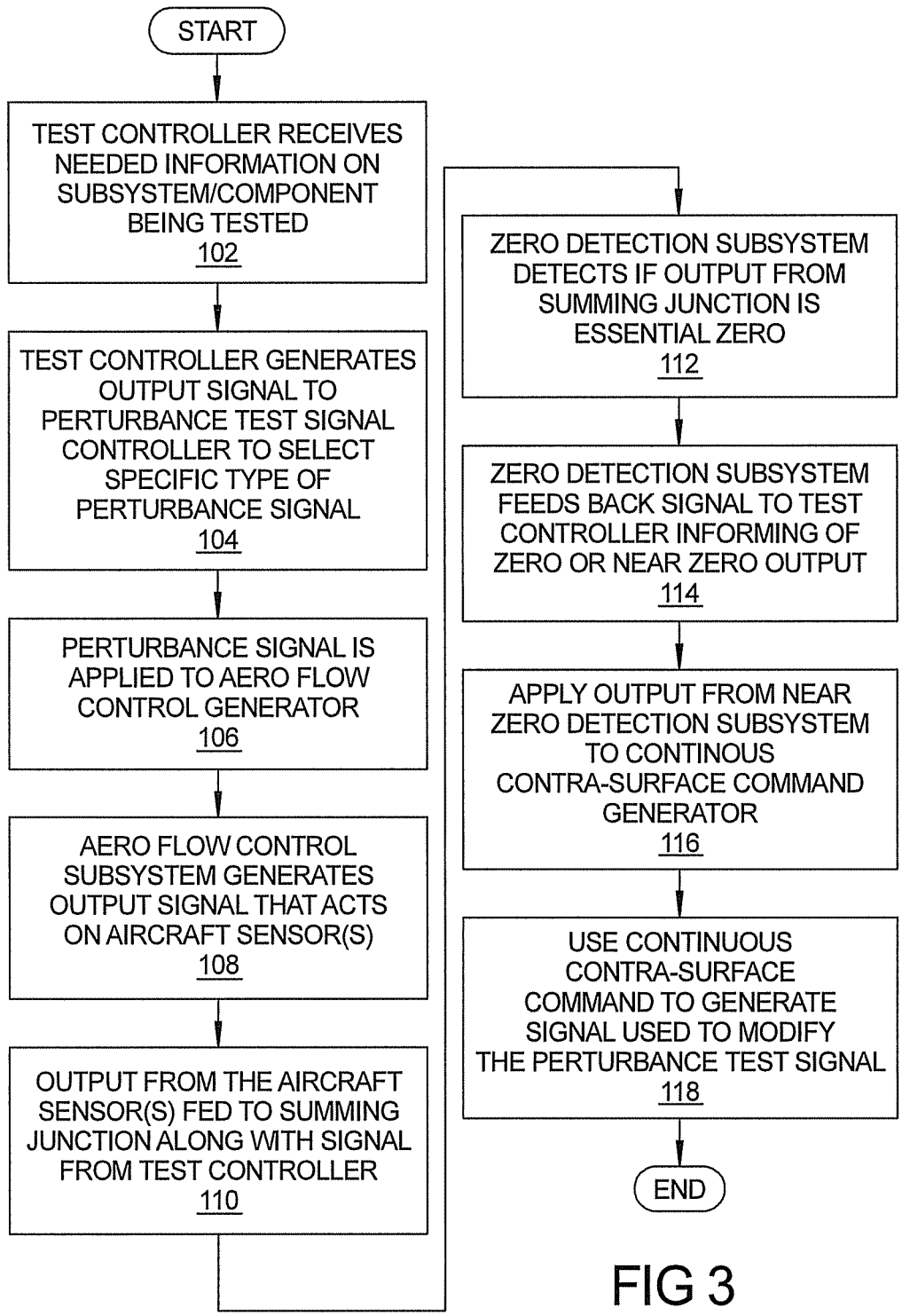
FIG. 3 is a flowchart illustrating exemplary operations that may be performed by the system of the present disclosure in carrying out a test of an existing component or subsystem of the mobile platform.

Referring now to the flowchart 100 of FIG. 3, a sequence of operations that may be performed by the system 10 is set forth. At operation 102 the test controller 30 receives needed information from the controller 22 as to component and/or parameter identification, component condition, etc. that the test controller 30 requires to carry out the test operation. At operation 104 the test controller 30 sends an output signal to the perturbance test signal generator 34 to generate a specific type of perturbance test signal, for example one of the types of signals shown in FIGS. 2A-2E. At operation 106 the perturbance test signal is applied to the aero flow control subsystem 38 which generates a flow control signal adjacent to the aircraft sensor or component being tested. At operation 108 the flow output from the aero flow control subsystem 38 acts on the aircraft 28. At operation 110 the output from the aircraft sensor(s) 28 is fed to the summing junction 40 along with an output signal from the test controller 30. At operation 112 the zero detection subsystem 42 detects whether or not the output from the summing junction 40 is essentially zero or within a small, predetermined range from zero, and if so generates a signal that is fed back to the test controller 30 indicating this condition, as indicated at operation 114. Thus, a closed loop test control system is formed between the test controller 30 and the aircraft sensor(s) 28 being tested. Importantly, the testing is accomplished non-intrusively relative to the aircraft's control system 12. Another significant advantage is that the controller 22 and other components of the aircraft control system 12 of the aircraft 14 are not used nor needed to implement the test.

At operation 116 the output signal from the zero detection subsystem 42 may also be applied to the continuous contra-surface command generator 44. The continuous contra-command test generator 44 may then generate a signal that is applied to the summing junction 36 to modify the perturbance signal.

Figure 4:
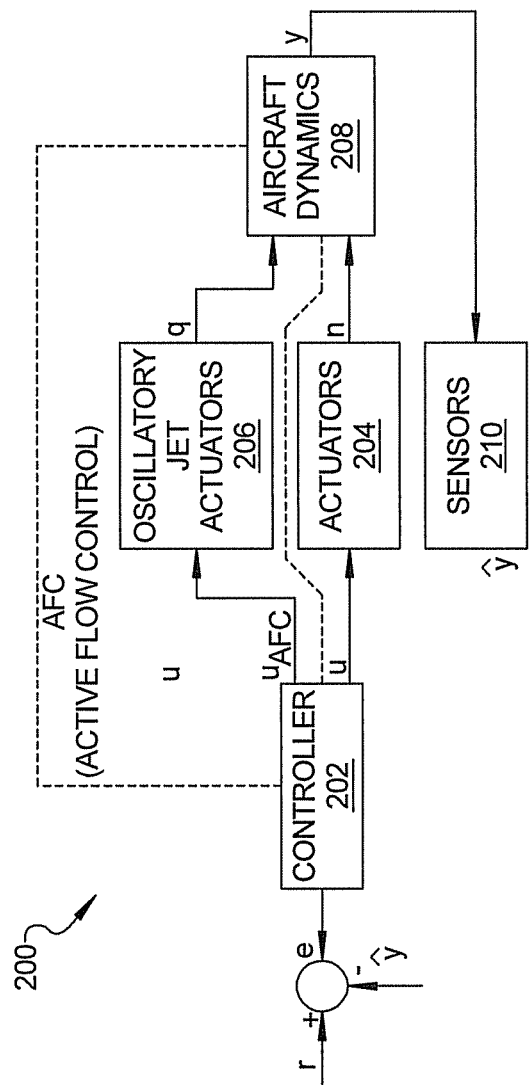
FIG. 4 is an alternative embodiment of the present disclosure in which a single hybrid controller is used to control both the existing components of the mobile platform as well as dedicated test components included on the mobile platform.

Referring to FIG. 4, a system 200 is shown in accordance with another embodiment of the present disclosure. The system 200 is carried by the aircraft 14 and makes use of a controller 202, an existing actuator (or actuators) 204 of the aircraft 14, an oscillatory jet actuator 206 that forms a dedicated test component, existing aircraft 208 (i.e., dynamic response of the aircraft airframe) of the entire aircraft 14 including the control system and existing sensor(s) 210. In the embodiment 200 the controller 202 controls both the dedicated test functions as well as the normal operating functions required to manage the subsystems and components of the aircraft 14.

Using active flow control (AFC) oscillatory jet actuation technology can result in a significant increase in control bandwidth that also enables independent control of airfoil lift, drag and pitching moments. Due to the high bandwidth capabilities of AFC-equipped aircraft, health assessment of the aircraft and its subsystems including its control system can be achieved if the behavior of these components or subsystems can be independently observed and processed. The much higher bandwidth of the oscillatory jet actuators enables the use of real-time broadband frequency response tests. These tests can be specifically synthesized to accentuate features in the observed frequency response of the aircraft dynamics and the aircraft's entire control system 12 (i.e., including controller, sensors, processors, actuators, and control surfaces), that are indicative and/or typical of degradation and failures. This may be accomplished by generating a specific synthesized reference signal carrying the test signal.

Figure 5:
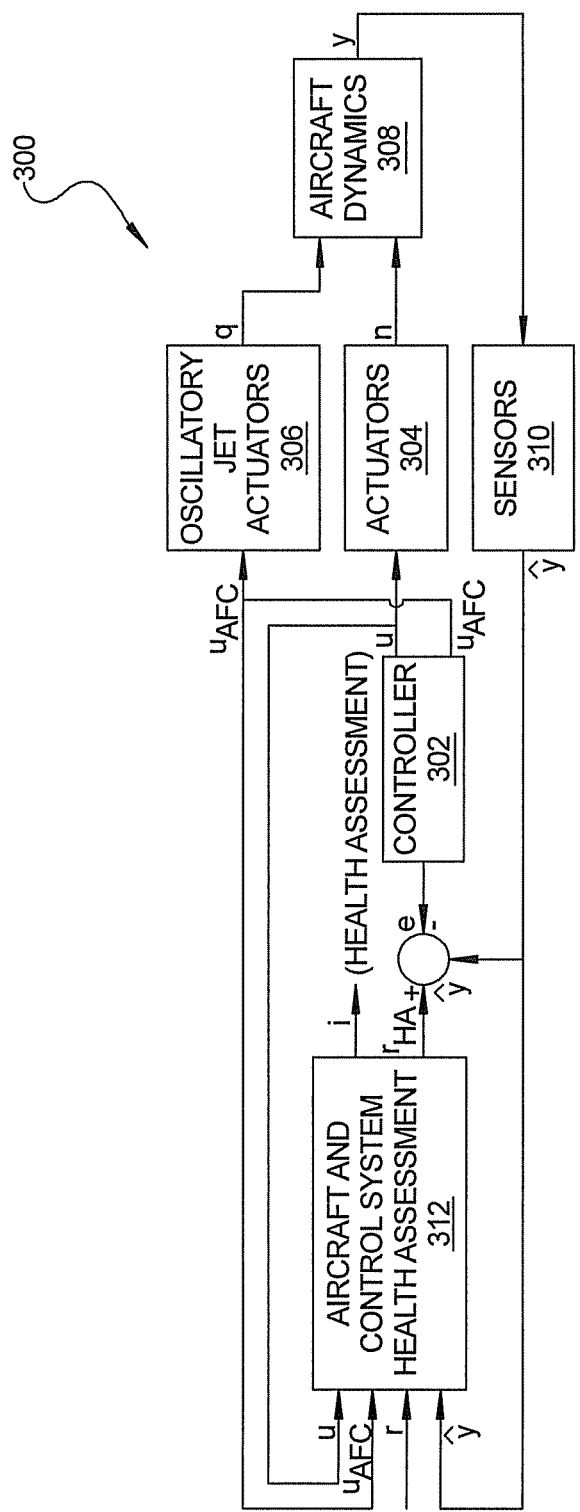
FIG. 5 is an alternative embodiment of the system of claim 4 in which a health assessment subsystem has been included for monitoring a health of the aircraft control system of the mobile platform.

Once the observed behavior in the form of measured feedback is sampled, processed and decoupled using the embodiment 200, component and subsystem performance specific information can be extracted to assess the capability and health of the entire system 200. An embodiment 300 of the present disclosure for enabling health evaluation of various subsystems and components being carried by the aircraft 14 is shown in FIG. 5. System 300 is identical to system 200, and thus components in common with the system 200 have been labeled with reference numbers increased by 100 over those used in FIG. 4. The system 300 makes use of an aircraft and control system health assessment subsystem 312. In FIG. 5, the various signals being output by the subsystems and components are:

u, which is the controller output to the main actuators 304;

$u_{AFC}$, which is the controller 302 AFC output to the oscillatory jet actuators 306;

r is the reference input to the aircraft control system;

$\hat{y}$ is the measured feedback signal from the aircraft's sensors 310;

i is the computed aircraft and control system health assessment (for example: remaining actuator life, linkage wear, backlash, steady state offset, reduced rates, changes in airframe dynamics etc); and $r_{HA}$ is the synthesized reference input to the controller 302 replacing the initial reference input.

The value $r_{HA}$ is synthesized and carries the specific test signals as well as the reference input to the controller 302.

Figure 6:
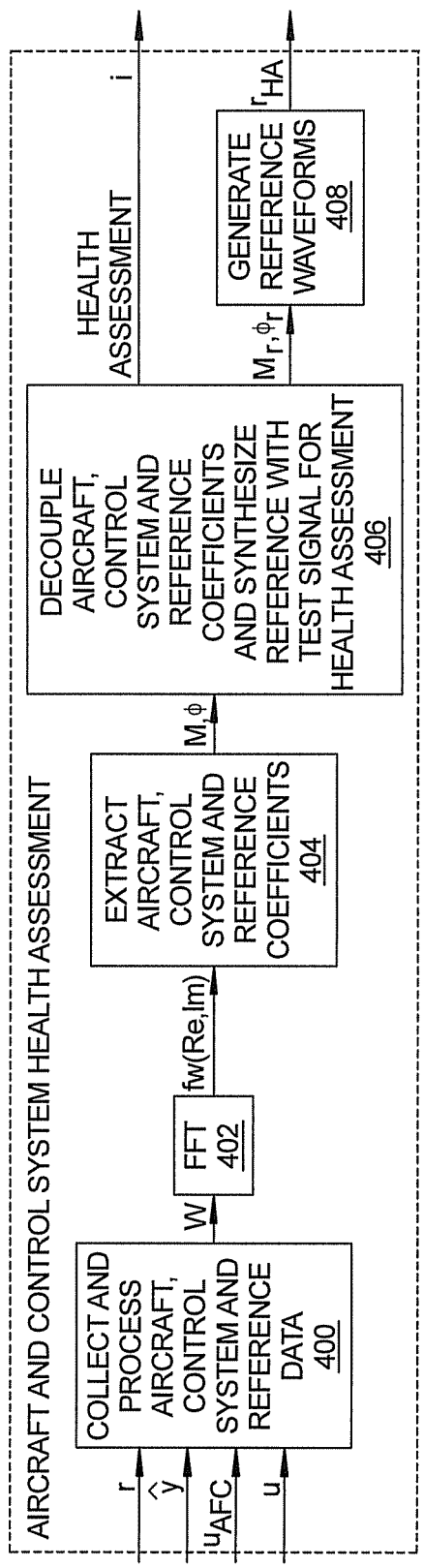
FIG. 6 is a flow diagram illustrating the operation of the system shown in FIG. 5.

In operation as shown in the flow diagram of FIG. 6, the observed dynamic behavior of the aircraft 14 and the entire system 300 is shown. Controller 302, sensors 310, actuators 302, and aircraft dynamics 308 are sampled in the form of measured feedback with the desired reference, control command (i.e., "u") for the actuators 304 as well as air flow control (AFC) command (i.e., "j") from the oscillatory jet actuators 306, as indicated at operation 400. Once the data is collected by the health assessment subsystem 312, utilizing digital signal processing, the data is transformed from time-domain to frequency-domain, as indicated at operation 402. This creates a dynamic signature portfolio with distinct component and subsystem profiles. Once the frequency-domain transformation is completed, a dynamic signature portfolio with magnitude and phase data components is extracted for further analysis, as indicated at operation 404. The magnitude and phase data components are then further processed for decoupling. The decoupling process, as indicated at operation 406, consists of selectively comparing known subsystem specific signatures with known magnitude and phase coefficients against sampled data components. Here, all system and subsystem specific frequency-domain magnitude and phase coefficients will be extracted and measured against the known and expected dynamic signatures. Therefore, any performance degradation or change in dynamic behavior will be detected by the health assessment subsystem 312 in the frequency-domain. Next, as indicated at operation 408, based on the computed system and subsystem specific performance, capability and health assessment, and in order to maximize efficiency and coverage of the components, a customized test (i.e., reference) signal is generated. The customized test signal may be combinations of doublet, impulse, sinusoidal, and other test inputs as indicated in FIGS. 2A-2E. The test signal is selected to confirm and to further assess the capability and the health of the entire system 300 or one or several specific subsystem(s) thereof. Finally, the signature of the test signal and the desired reference signal, both in the form of frequency magnitude and phase coefficients, will be mixed in order to synthesize and generate a new reference waveform.

The embodiments of the present disclosure all provide various significant advantages and benefits in non-intrusively monitoring and testing the various components and subsystems of a mobile platform, as well as enabling considerable cost savings over pre-existing system test arrangement: For example, the various embodiments described herein enable on-line identification of aircraft model parameters, thus shortening the time required for flight testing. The various embodiments enable independent determination of control system health condition, thus providing a means to shorten the time required to verify and validate aircraft control systems. The various embodiments also enable the application of adaptive control methods through real-time independent determination of aircraft dynamic characteristics and systems health. The various embodiments enable the application of reconfigurable methods through real-time independent determination of aircraft dynamic characteristics and systems health. The various embodiments enable the continued monitoring and parameter identification subsequent to control system reconfiguration. The various embodiments also enable the use of high bandwidth controlled excitation test signals, thus providing a means to quickly determine structural dynamics during flight at all flight and load conditions. The various embodiments enable a more accurate health assessment by using test signals customized for specific parameter identification and operating during flight under varying environmental conditions. Finally, the various embodiments enable real-time monitoring and control independent of control system degradation monitoring and fault identification.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A method of testing a component of a mobile platform without requiring a controller of an aircraft control system of the mobile platform to perform a test operation, where the component forms a part of the aircraft control system, the method comprising:
    using a test controller to obtain information from the controller of the aircraft control system concerning a specific component of the mobile platform to be tested, and to initiate a said test operation on the specific component, said test controller forms a portion of a non-intrusive test system carried on the mobile platform and the test controller is useable during operation of the mobile platform during flight operations;
    using said test operation to generate a perturbance test signal;
    applying said perturbance test signal to an aero test subsystem of the non-intrusive test system, which is carried on said mobile platform but operable independent of said aircraft control system, to cause the aero test subsystem to generate an airflow signal in proximity to the specific component being tested;
    using said airflow signal generated by the aero test subsystem to act on said component of said aircraft control system;
    evaluating a response of said component; and
    providing information on the response back to the test controller.

2. The method of claim 1, further comprising analyzing said response of said component to determine a condition of operation of said controller of said aircraft control system.

3. The method of claim 2, further comprising using said test controller to modify said perturbance test signal based in part on an output of said component.

4. The method of claim 3, further comprising summing said output of said component with a secondary signal to produce a summed signal, and using said test controller to analyze said summed signal.

5. The method of claim 4, further comprising analyzing said summed signal and modifying said perturbance test signal in response to a value of said summed signal.

6. The method of claim 1, wherein said using a test controller comprises using a test controller being controlled by an algorithm designed to implement a specific test operation for the specific component being tested.

7. A method of testing a component of a mobile platform without requiring a controller of an on-board control system of the mobile platform to perform a desired test operation, the method comprising:
    initiating said desired test operation using a test controller carried on the mobile platform during normal operation of the mobile platform, the test controller forming a portion of a non-intrusive test system carried on the mobile platform and used during operation of the mobile platform;
    using the test controller to communicate with the controller of the on-board control system to obtain information concerning the component of the mobile platform to be tested, and using the test controller to implement the desired test operation on the component independent of instructions from the controller, the desired test operation controlling a test signal generating subsystem independent of said on-board control system and forming a portion of the non-intrusive test system, to generate a perturbance test signal;
    applying the perturbance test signal to a test subsystem that forms a portion of the non-intrusive test system and is operable independently of the on-board control system of the mobile platform, the perturbance test signal being applied only for test purposes, the test subsystem generating an airflow flow signal which acts on said component of the mobile platform while the mobile platform is operating;
    monitoring a response of the component of the mobile platform to determine a performance of the component;
    generating a feedback signal representative of an output of said component of the mobile platform; and
    using the feedback signal to further control operation of the test operation.

8. The method of claim 7, wherein said test controller does not form a portion of said on-board control system.

9. The method of claim 7, wherein said applying the perturbance test signal to the test subsystem comprises applying the perturbance test signal in a vicinity of said component of the mobile platform.

10. The method of claim 7, wherein monitoring the response of the component of the mobile platform comprises:
    summing an output of said component with a secondary input signal to produce a summed output; and
    analyzing said summed output to determine changes needing to be made to said test signal generating subsystem.

11. The method of claim 10, further comprising:
    summing said summed output with said perturbance test signal to generate a modified test signal; and applying said modified test signal to said component of the mobile platform.

12. The method of claim 7, wherein said mobile platform comprises an airborne mobile platform.

13. The method of claim 12, wherein said test subsystem acting on the component comprises a flow control subsystem acting on a flight control component of said airborne mobile platform.

14. A system for testing a component of a mobile platform without requiring a controller of an on-board control system of the mobile platform to perform a test operation, the system comprising:

a test controller forming a portion of a non-intrusive test system, where the non-intrusive test system is carried on said mobile platform and used during operation of the mobile platform, the test controller operable to generate said test operation and is configured to communicate with the controller of the on-board control system to obtain information on the component being tested, the test controller further operable independent of said on-board control system;

a perturbance test signal generating system for generating a perturbance test signal responsive to said test operation, the perturbance test signal generating system forms a portion of the non-intrusive test system;

a test subsystem carried on said mobile platform but operable independent of said on-board control system, and being responsive to said perturbance test signal, for generating an airflow flow signal which is able to influence operation of said component of said mobile platform; and said test controller further adapted to evaluate a response by said component of said mobile platform independently of said controller and while said mobile platform is being operated is in use, and to use said response to control said test operation.

15. The system of claim 14, wherein said mobile platform comprises an airborne mobile platform, and said component comprises a flow control component.

16. The system of claim 15, wherein said test subsystem comprises a flow generating device for influencing operation of said flow control component.

17. The system of claim 14, wherein said test controller is adapted to implement an algorithm for testing one of:

said component of said mobile platform; and a specific operation of said on-board control system of said mobile platform.

* * * * *